United States Patent
Reznicek et al.

(10) Patent No.: US 11,682,718 B2
(45) Date of Patent: Jun. 20, 2023

(54) VERTICAL BIPOLAR JUNCTION TRANSISTOR WITH ALL-AROUND EXTRINSIC BASE AND EPITAXIALLY GRADED INTRINSIC BASE

(71) Applicant: INTERNATIONAL BUSINESS MACHINES CORPORATION, Armonk, NY (US)

(72) Inventors: Alexander Reznicek, Troy, NY (US); Bahman Hekmatshoartabari, White Plains, NY (US); Tak H. Ning, Yorktown Heights, NY (US); Liying Jiang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 42 days.

(21) Appl. No.: 17/301,807

(22) Filed: Apr. 15, 2021

(65) Prior Publication Data
US 2022/0336645 A1 Oct. 20, 2022

(51) Int. Cl.
*H01L 29/732* (2006.01)
*H01L 29/737* (2006.01)
*H01L 29/66* (2006.01)

(52) U.S. Cl.
CPC ...... *H01L 29/732* (2013.01); *H01L 29/66272* (2013.01); *H01L 29/66318* (2013.01); *H01L 29/7371* (2013.01)

(58) Field of Classification Search
None
See application file for complete search history.

(56) References Cited

U.S. PATENT DOCUMENTS

| | | | |
|---|---|---|---|
| 4,745,085 A | * | 5/1988 | Shieh .................. H01L 21/8252 257/E27.012 |
| 5,137,840 A | | 8/1992 | Desilets |
| 5,352,912 A | | 10/1994 | Crabbe |

(Continued)

FOREIGN PATENT DOCUMENTS

WO    2020229899 A1    11/2020

OTHER PUBLICATIONS https://www.freiberger.com/en/products/applications/wireless-communication/, "Wireless Communication", HBT, Hetero junction Bi-polar Transistor, Accessed on Dec. 10, 2019, 6 pages.

(Continued)

*Primary Examiner* — Xiaoming Liu
(74) *Attorney, Agent, or Firm* — Lily Neff

(57) ABSTRACT

A vertical bipolar junction transistor may include an intrinsic base epitaxially grown on a first emitter or collector, the intrinsic base being compositionally graded, a second collector or emitter formed on the intrinsic base, and an extrinsic base formed all-around the intrinsic base. The extrinsic base may be isolated from the first emitter or collector by a first spacer. The extrinsic base may be isolated from the second collector or emitter by a second spacer. The extrinsic base may have a larger bandgap than the intrinsic base. The intrinsic base may be doped with a p-type dopant, and the first emitter or collector, and the second collector or emitter may be doped with an n-type dopant. The first emitter or collector, the intrinsic base, and the second collector or emitter may be made of a III-V semiconductor material.

19 Claims, 14 Drawing Sheets

(56) References Cited

U.S. PATENT DOCUMENTS

| | | |
|---|---|---|
| 6,765,242 B1 | 7/2004 | Chang et al. |
| 6,784,450 B2 | 8/2004 | Pan |
| 6,847,060 B2 | 1/2005 | Welser |
| 7,170,112 B2 | 1/2007 | Ning |
| 9,525,027 B2 | 12/2016 | Hashemi |
| 10,115,800 B1 | 10/2018 | Kim |
| 2019/0097022 A1 | 3/2019 | Kim |
| 2019/0157416 A1* | 5/2019 | Balakrishnan .......... H01L 29/04 |
| 2019/0207011 A1* | 7/2019 | Reznicek ............ H01L 29/7371 |

OTHER PUBLICATIONS

Rodwell, "InP HBTs: Process Technologies and Integrated Circuits," 17th International Conference on Indium Phosphide and Related Materials, IPRM'05, Glasgow, Scotland, UK, 2005, Downloaded from the Internet Dec. 10, 2019, 122 pages.

Sze et al., "Liquid phase oxidation for InGaP/GaAs HBT passivation," Semiconductor Science And Technology, vol. 21, 2006, pp. 1160-1166, Institute of Physics Publishing.

International Searching Authority, Notification of Transmittal of the International Search Report and the Written Opinion of the International Searching Authority, or the Declaration, International application No. PCT/IB2022/052519, International Filing Date Mar. 21, 2022, dated Jun. 28, 2022, 6 pages.

Reznicek, et al., "Vertical Bipolar Junction Transistor", International Application No. PCT/IB2022/052519, Filed Mar. 21, 2022, 34 pages.

\* cited by examiner

US 11,682,718 B2

VERTICAL BIPOLAR JUNCTION TRANSISTOR WITH ALL-AROUND EXTRINSIC BASE AND EPITAXIALLY GRADED INTRINSIC BASE

BACKGROUND

The present invention relates generally to a semiconductor structure and a method of forming the same. More particularly, the present invention relates to a semiconductor structure that includes a vertical bipolar junction transistor (BJT) with an all-around extrinsic base and an epitaxially graded intrinsic base.

Bipolar transistors comprised of compound semiconductors may enable a wide range of applications. Bipolar transistors may be utilized as high-speed devices based on narrow-bandgap semiconductor materials. Bipolar transistors may also be utilized as high-voltage devices based on wide-bandgap semiconductor materials.

SUMMARY

According to one embodiment of the present invention, a semiconductor structure is provided. The semiconductor structure may include a vertical bipolar junction transistor. The vertical bipolar junction transistor may include an intrinsic base epitaxially grown on a first emitter or collector, the intrinsic base being compositionally graded, a second collector or emitter formed on the intrinsic base, and an extrinsic base formed all-around the intrinsic base. The extrinsic base may be isolated from the first emitter or collector by a first spacer. The extrinsic base may be isolated from the second collector or emitter by a second spacer. The extrinsic base may have a larger bandgap than the intrinsic base. The intrinsic base may be doped with a p-type dopant, and the first emitter or collector, and the second collector or emitter may be doped with an n-type dopant. The first emitter or collector, the intrinsic base, and the second collector or emitter may be made of a III-V semiconductor material.

According to another embodiment of the present invention, a semiconductor structure is provided. The semiconductor structure may include a vertical bipolar junction transistor. The vertical bipolar junction transistor may include an intrinsic base epitaxially grown on a first emitter or collector, the intrinsic base may be compositionally graded, an isolation layer separating the first emitter or collector from a substrate, a second collector or emitter formed on the intrinsic base, and an extrinsic base formed all-around the intrinsic base. The extrinsic base may be isolated from the first emitter or collector by a first spacer, the extrinsic base may be isolated from the second collector or emitter by a second spacer. The extrinsic base may have a larger bandgap than the intrinsic base. The intrinsic base may be doped with a p-type dopant, and the first emitter or collector, and the second collector or emitter may be doped with an n-type dopant. The first emitter or collector, the intrinsic base, and the second collector or emitter may be made of a III-V semiconductor material.

According to another embodiment of the present invention, a method is provided. The method may include forming a vertical bipolar junction transistor by epitaxially growing an intrinsic base on a first emitter or collector, epitaxially growing a second collector or emitter on the intrinsic base, and epitaxially growing an extrinsic base all-around the intrinsic base. The extrinsic base may be isolated from the first emitter or collector by a first spacer. The extrinsic base may be isolated from the second collector or emitter by a second spacer. The intrinsic base may be compositionally graded. The compositionally graded intrinsic base may be made of indium aluminum gallium arsenide. Compositionally grading the intrinsic base may include increasing an aluminum content and decreasing a gallium content within the intrinsic base. Increasing the aluminum content and decreasing the gallium content within the intrinsic base may increase a bandgap of the intrinsic base. The bandgap of the intrinsic base may be smaller in a portion of the intrinsic base that contains more gallium and less aluminum. The extrinsic base may have a larger bandgap than the intrinsic base. The intrinsic base may be doped with a p-type dopant, and the first emitter or collector, and the second collector or emitter may be doped with an n-type dopant.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
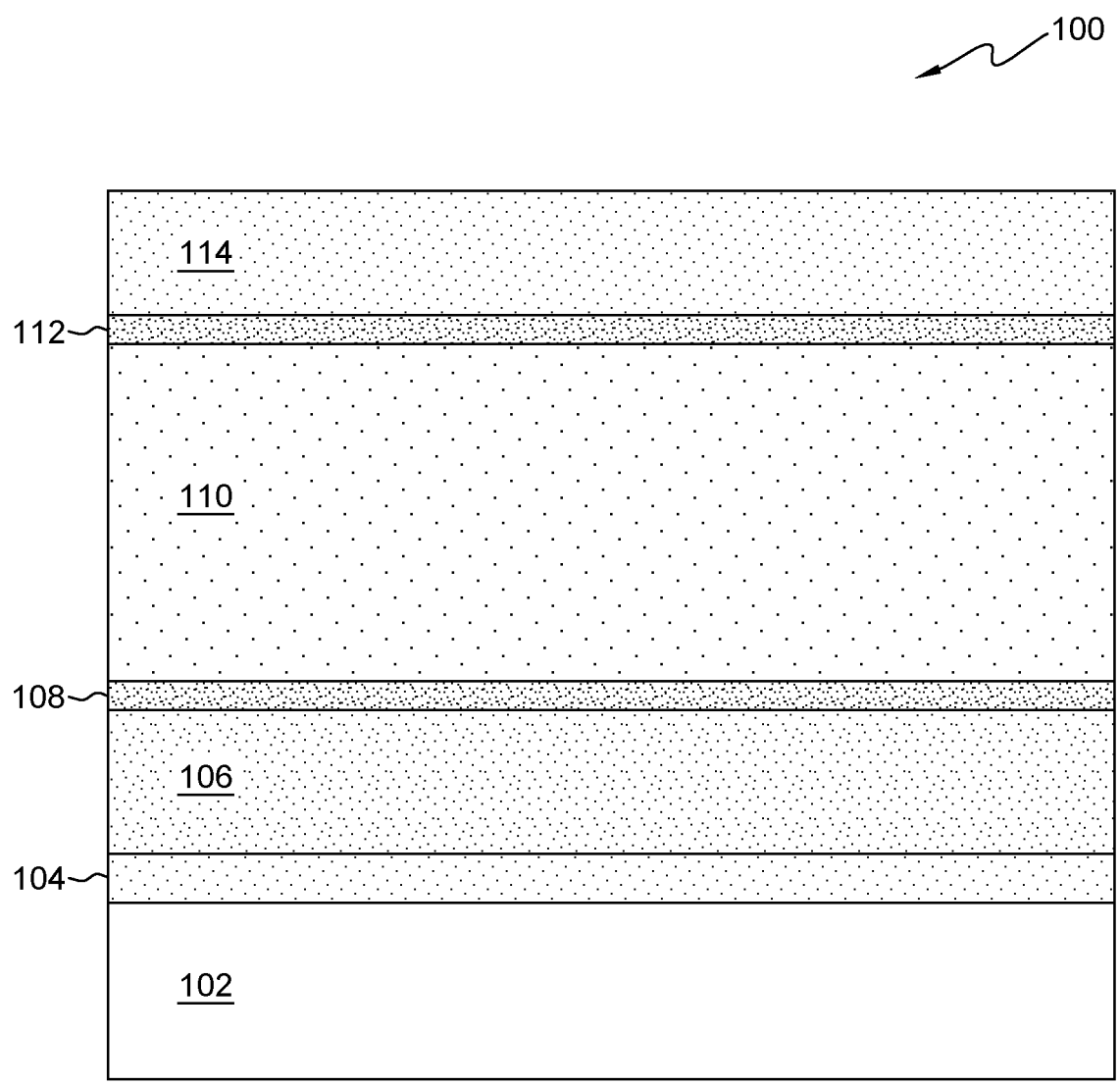
FIG. 1 is a cross section view illustrating an emitter, a sacrificial layer, and a first dielectric layer arranged on a substrate according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention relate generally to a semiconductor structure and a method of forming the same. More particularly, the present invention relates to a semiconductor structure that includes a vertical bipolar junction transistor (BJT) with an all-around extrinsic base and an epitaxially graded intrinsic base.

A bipolar junction transistor (BJT) is a type of a transistor that uses both electrons and holes as charge carriers. The BJT may allow a small current injected at one of its terminals to control a much larger current flowing between two other terminals, making the device capable of amplification or switching.

A conventional vertical BJT may include a compound semiconductor stack that is comprised of various semiconductor layers that have varying bandgaps. Once formed, the semiconductor stack may be patterned in a stair-wise manner using selective etchants in order to make the required contacts. As a result, the top stack has a tapered structure, with the top portion being narrower than the middle portion, and the middle portion being narrower than the bottom portion. This may result in reduced device density because of the area consumed for the contacts. Further, the process of etching to create the contacts may damage the sidewalls of the stack. Moreover, the lateral separation between the contacts and active regions of the vertical BJT result in increased contact resistance. As such, there exists a need to form a dense vertical BJT with low contact resistance and substantially damage-free sidewalls.

Embodiments of the present invention propose a vertical BJT with an all-around extrinsic base with an intrinsic base. More particularly, embodiments of the present invention propose the extrinsic base surrounding an intrinsic base, where the extrinsic base has a wider bandgap when compared to the bandgap of the intrinsic base. Having an all-around extrinsic base surrounding the intrinsic base reduces base leakage, reduces contact resistance, and provides better electrical control over the intrinsic base. Further, embodiments of the present invention allow the contacts to be formed without damaging the sidewalls of the intrinsic base and the extrinsic base.

FIGS. 1-13 illustrate exemplary structure of a vertical BJT with an all-around extrinsic base and an epitaxially graded intrinsic base as well as a method of making the same, in accordance with an embodiment. It will be appreciated that, as known in the art, the designation of emitter and collector terminals is dependent on the polarity of the voltage applied to the bipolar transistor during operation. For example, in an n-p-n transistor, the collector is biased with a positive voltage polarity with respect to the emitter, whereas in a p-n-p transistor, the collector is biased with a negative voltage polarity with respect to the emitter. Therefore, depending on the polarity of the voltages applied to the bipolar transistor, an emitter (e.g. 106 in FIG. 1-13) may function as a collector, and a collector (e.g. 134 in FIG. 11-13) may function as an emitter. Therefore, the designation of the said regions and terminals as emitter or collector (e.g. 106 and 134) is interchangeable.

Referring now to FIG. 1, a structure 100 is shown, in accordance with an embodiment. The structure 100 may include a substrate 102, an isolation layer 104, an emitter 106, a first spacer 108, a sacrificial layer 110, a second spacer 112, and a first dielectric layer 114. The substrate 102 may include one or more semiconductor materials. For example, in an embodiment, the substrate 102 may be an indium phosphide wafer. In another embodiment, the substrate 102 may be made of III-V materials, such as, for example gallium arsenide, indium arsenide, or aluminum arsenide, with a top surface made of indium phosphide. In a further embodiment, the substrate 102 may be a silicon wafer with a III-V materials buffer layer and an indium phosphide top surface. In yet another embodiment, the substrate 102 is a semiconductor material which allows a lattice matched formation of the described device structure. The BJT may also be formed using combinations of silicon, silicon-germanium (SiGe), and/or germanium. Additional gallium arsenide and germanium or other lattice matched semiconductor equivalents may be used.

The isolation layer 104 is grown on the top surface of the substrate 102, and may have a thickness between 50-100 nm, in some embodiments. The isolation layer 104 is comprised of a semi-insulating semiconductor with a wide bandgap and a low doping concentration. In an exemplary embodiment, where the top surface of the substrate 102 is comprised of indium phosphide, the isolation layer 104 is made of indium aluminum arsenide ($In_{0.52}Al_{0.48}As$), which is lattice-matched to, and has a wider bandgap than indium phosphide. In preferred embodiments, the isolation layer 104 is substantially undoped and has a wider bandgap than the substrate 102.

Once the isolation layer 104 is grown to a desired thickness, the emitter 106 is then grown on the top surface of the isolation layer 104. The emitter 106 may be referred to as a first emitter or collector 106. In some embodiments, the emitter 106 may have a thickness in the range of 10-50 nm but thinner or thicker layers may also be used. The emitter 106 is in-situ heavily doped with an n-type dopant, such as, for example, tellurium. In an exemplary embodiment, where the isolation layer 104 is made of indium aluminum arsenide, the emitter 106 is made of epitaxially grown indium gallium aluminum arsenide. A composition is chosen where the bandgap is slightly larger than the bandgap of indium gallium arsenide ($In_{0.53}Ga_{0.47}Ga$), but sufficiently conductive. One exemplary composition of indium gallium aluminum arsenide would be $In_{0.53}Al_{0.02}Ga_{0.45}As$. Other lattice matched InGaAlAs compositions matching above application requirements may be chosen. The aluminum content may be 1-10% maximum.

To form said InGaAlAs, the epitaxial precursors for indium, gallium, and aluminum are flown at the same time in the process reactor, together with the arsenic source. The ratio between the In—, Ga—, Al source as well as the process conditions will define the composition grown. The indium source may be Trimethylindium (TMIn), the gallium source may be trimethylgallium (TMGa), and the aluminium source may be Trimethylaluminium (TMAl). The arsenic source may be Arsine ($AsH_3$) or metal organic arsenic compounds like Tertiarybutylarsine (TBAs). In some embodiments, the emitter 106 has a bottom portion that is heavily doped with an n-type dopant (to reduce series resistance), and a top portion with relatively lower doping of the same type, e.g. moderately doped with an n-type dopant (to reduce Auger recombination). In another exemplary embodiment where the substrate is comprised of semi-insulating gallium arsenide, the emitter 106 is comprised of epitaxially grown heavily-doped n-type gallium arsenide or indium gallium arsenide.

Next, the sacrificial layer 110 is deposited on the emitter 106 between the first spacer 108 and the second spacer 112. The first spacer 108 is deposited on the emitter 106, the sacrificial layer 110 is deposited on the first spacer 108, and the second spacer 112 is deposited on the sacrificial layer 110. The first spacer 108 may also be known as a bottom spacer. The second spacer 112 may also be known as a top spacer.

The first spacer 108 and the second spacer 112 may include an insulating material, such as, for example, silicon dioxide, silicon nitride, SiOCN, or SiBCN. Other non-limiting examples of materials for the first spacer 108 and the second spacer 112 may include dielectric oxides (e.g., silicon oxide), dielectric nitrides (e.g., silicon nitride), dielectric oxynitrides, or any combination thereof. The first spacer 108 and the second spacer 112 materials are deposited by a deposition process, for example, chemical vapor deposition (CVD) or physical vapor deposition (PVD). The first spacer 108 and the second spacer 112 may each have a thickness of about 3 to about 15 nm, or of about 5 to about 10 nm.

The sacrificial layer 110 may include a sacrificial gate material, for example, amorphous silicon (α-Si) or polycrystalline silicon (polysilicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial material forming the sacrificial layer 110 may have a thickness of about 8 nm to about 100 nm, or from about 10 nm to about 30 nm.

The first dielectric layer 114 is deposited on a top surface of the second spacer 112, over the sacrificial layer 110. The first dielectric layer 114 may also be referred to as an oxide layer. Non-limiting examples of materials for the first dielectric layer 114 may include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The first dielectric layer 114 may have a thickness in a range from about 30 nm to about 200 nm, or from about 50 nm to about 100 nm. After the first dielectric layer 114 is deposited, the structure 100 may undergo a planarization process, such as, for example, a chemical mechanical polishing (CMP) process, to smooth out the top surface of the first dielectric layer 114.

Figure 2:
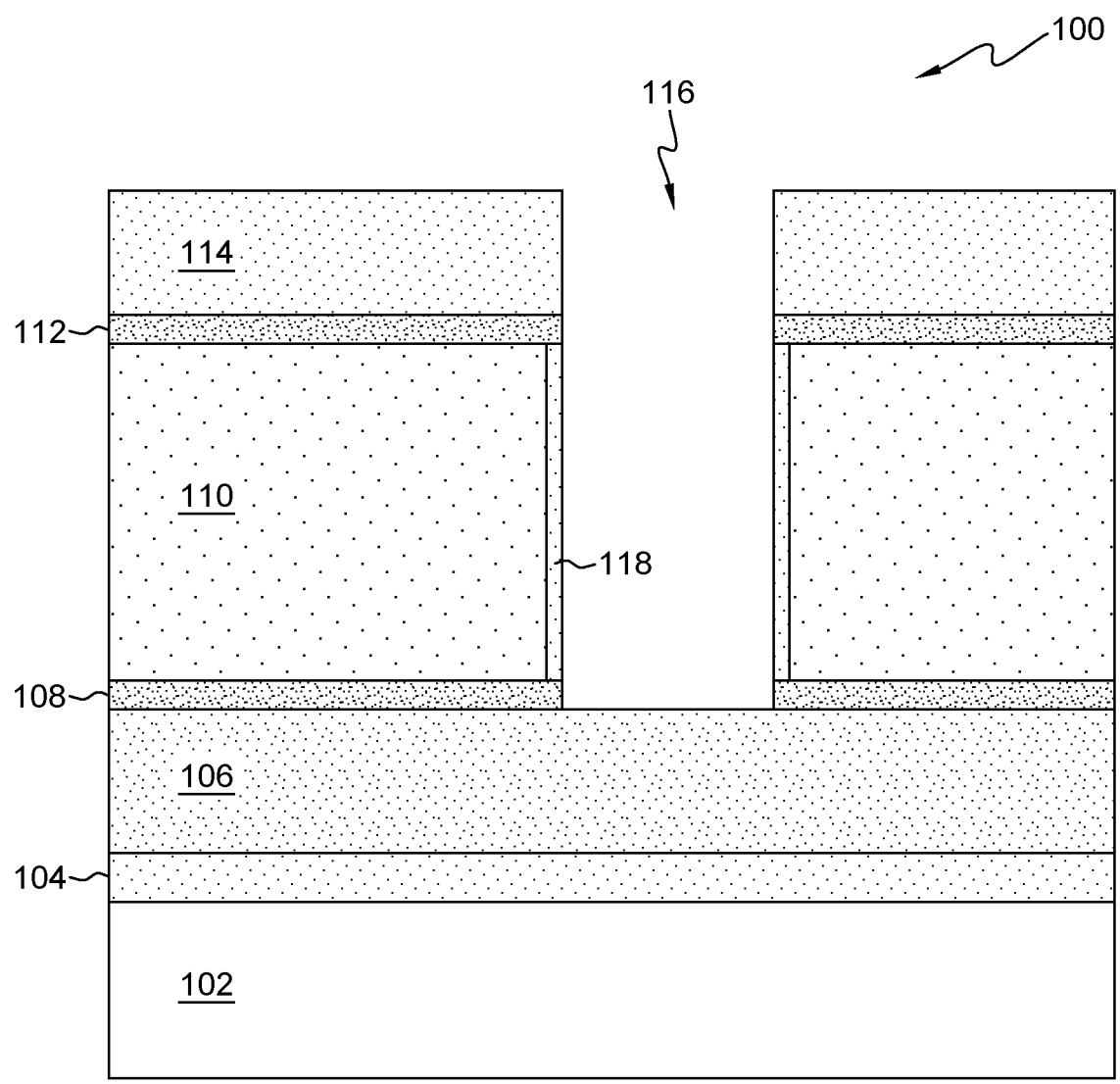
FIG. 2 is a cross section view illustrating a trench formed to expose the emitter according to an exemplary embodiment.

Referring now to FIG. 2, the structure 100 with a trench 116 is shown, in accordance with an embodiment. The trench 116 extends from a top surface of the first dielectric layer 114 to the emitter 106, exposing the top surface of the emitter 106. The trench 116 is formed by performing one or more etch processes that are selective to (will not substantially remove), and stop at, the emitter 106 material. The etch process may be, for example, a reactive ion etch. For example, a first etch process may be performed to remove a portion of the first dielectric layer 114, the second spacer 112, and the sacrificial layer 110 selective to the material of the first spacer 108.

Once the top surface of the first spacer 108 is exposed, the exposed sidewall portions of the second spacer 112 and the exposed sidewall portions of the sacrificial layer 110 are oxidized. The oxidation allows for a layer of oxide 118 to be formed along the exposed sidewalls of the sacrificial layer 110 and the first spacer 112. The oxidation may be performed by a plasma oxidation process or other oxidation process that forms the layer of oxide 118. A second etch process is performed to remove the exposed portion of the first spacer 108, thereby exposing a top surface of the emitter 106. The resulting trench 116 may extend through the top surface of the first dielectric layer 114 down to the top surface of the exposed portion of the emitter 106.

Figure 3:
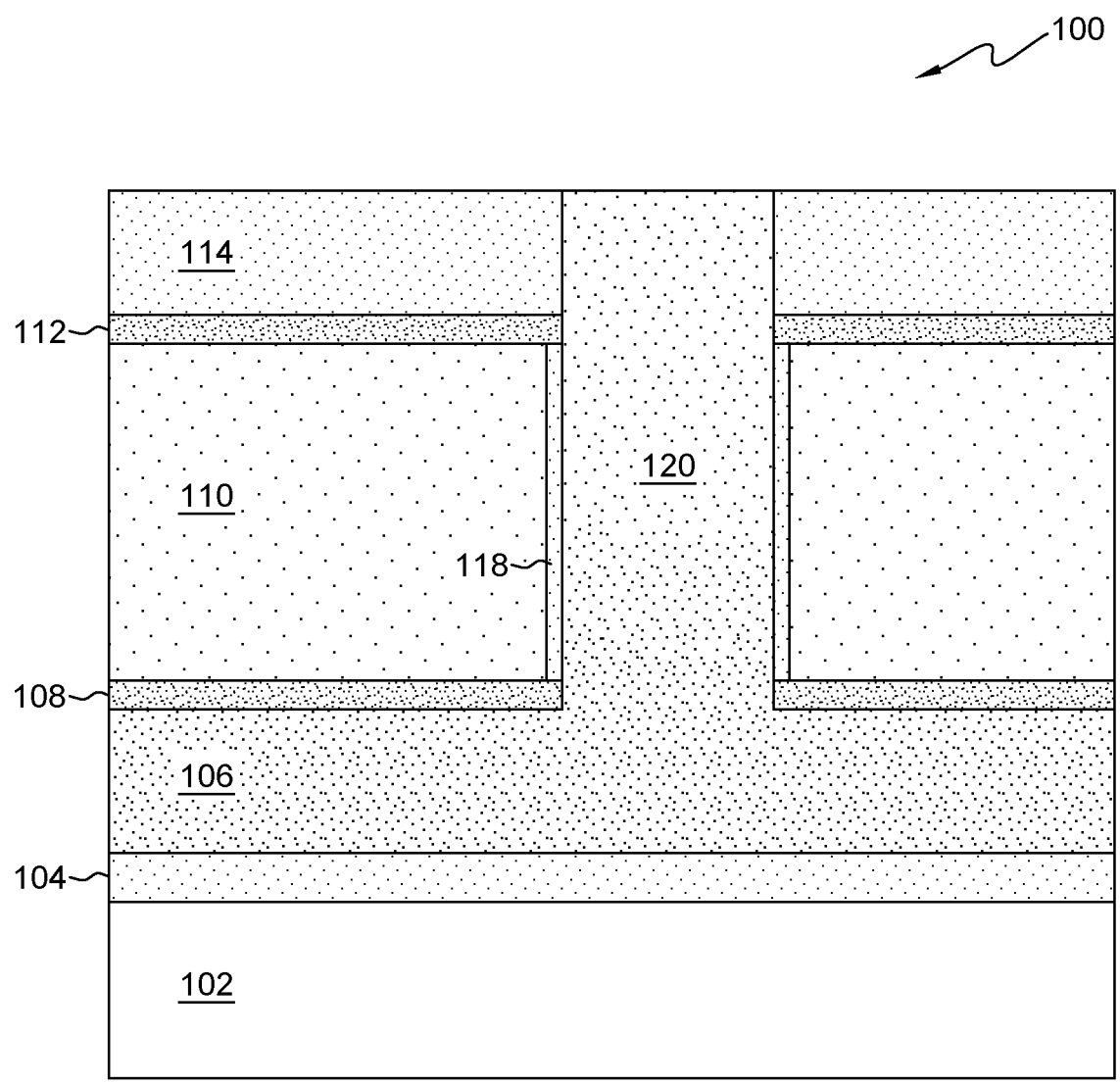
FIG. 3 is a cross section view illustrating an intrinsic base according to an exemplary embodiment.

Referring now to FIG. 3, the structure 100 with an intrinsic base 120, is shown in accordance with an embodiment. Once the first spacer 108 is removed from the bottom of the trench 116, an epitaxial layer is grown on the exposed top surface of the emitter 106 to form the intrinsic base 120. The intrinsic base 120 may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The intrinsic base 120 has a lattice constant that is the same or substantially the same as the lattice constant of the emitter 106. Further, the composition of the intrinsic base 120 is varied (i.e. graded) during the epitaxial growth to achieve a graded bandgap. In one example, the intrinsic base 120 may include indium aluminum gallium arsenide and the bandgap of the intrinsic base 120 may be gradually increased during epitaxial growth by gradually increasing the aluminum content and gradually decreasing the gallium content while maintaining substantially the same lattice constant, as known in the art and as described herein with respect to FIG. 1. The bottom portion of the intrinsic base 120 closest to the emitter 106 therefore contains more gallium and less aluminum than the top portion of the intrinsic base 120 closest to the top surface of the first dielectric layer 114. Since the bottom portion of the intrinsic base 120 contains more gallium and less aluminum than the top portion of the intrinsic base 120, the bottom portion of the intrinsic base 120 has a smaller bandgap when compared to the bandgap of the top portion of the intrinsic base 120. The change in the aluminum and gallium composition within the intrinsic base 120 creates a compositional gradient within the intrinsic base 120. As known in the art, a gradually varying (i.e. graded) bandgap profile may be beneficial in facilitating efficient carrier transport through the base, as compared to an abruptly changing bandgap profile. In an alternative embodiment, when the emitter 106 acts as a collector, the top portion of the intrinsic base 120 may contain more gallium and less aluminum than the bottom portion of the intrinsic base 120. As a result, the top portion of the intrinsic base 120 may have a smaller bandgap when compared to the bandgap of the bottom portion of the intrinsic base 120.

The intrinsic base 120 is in-situ doped with a p-type dopant, such as, for example, magnesium. The dopant of the intrinsic base 120 is different from the dopant of the emitter 106. For example, if the emitter 106 is doped with an n-type dopant, then the intrinsic base 120 is doped with a p-type dopant. Further, the doping levels are also different. For example, the emitter 106 may be heavily doped with an n-type dopant whereas the intrinsic base 120 may be moderately or lightly doped with a p-type dopant. The doping of the intrinsic base 120 may be maintained at a substantially constant level during epitaxial growth or varied (graded) as desired.

During the growth process, the epitaxial growth in the intrinsic base 120 may vertically extend over the first dielectric layer 114 (not illustrated). A planarization process, such as, for example, a chemical mechanical polishing (CMP) process, may be used to remove the epitaxial overgrowth over the first dielectric layer 114. As a result, the top surface of the intrinsic base 120 is substantially flush with the top surface of the first dielectric layer 114.

Figure 4:
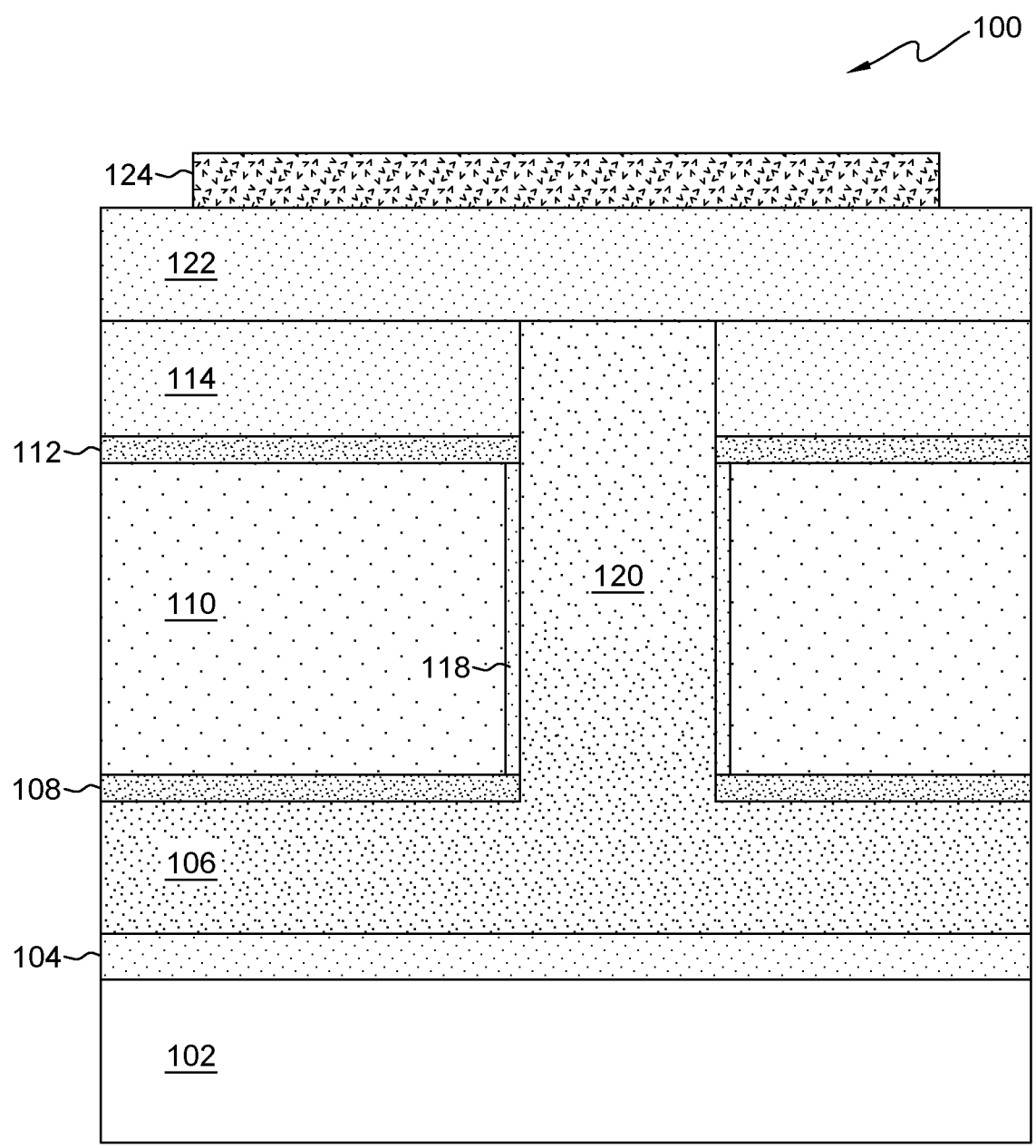
FIG. 4 is a cross section view illustrating a first mask formed on top of a second dielectric layer according to an exemplary embodiment.

Referring now to FIG. 4, the structure 100 with a second dielectric layer 122 and a first mask 124 is shown, in accordance with an embodiment. The second dielectric layer 122 is deposited on the top surface of the first dielectric layer 114 and the intrinsic base 120 using known deposition techniques, such as, for example, atomic layer deposition. The second dielectric layer 122 may be made of materials that are identical or substantially identical to the materials of the first dielectric layer 114. After the deposition of the second dielectric layer 122, a planarization process, such as, CMP, may be used to remove excess of the second dielectric layer 122 from the top surface of the structure 100.

The first mask 124 is deposited on the top surface of the second dielectric layer 122, such that the first mask 124 is wider than the intrinsic base 120 and covers the intrinsic base 120 such that portions of the first mask 124 overlap the intrinsic base 120 and extend beyond the intrinsic base 120. The first mask 124 is deposited using known deposition techniques, such as, for example, atomic layer deposition. The first mask 124 may be made of material that is resistant to different etch processes, thus protecting the portions of the structure 100 that are covered by the first mask 124 during subsequent etch processes.

Figure 5:
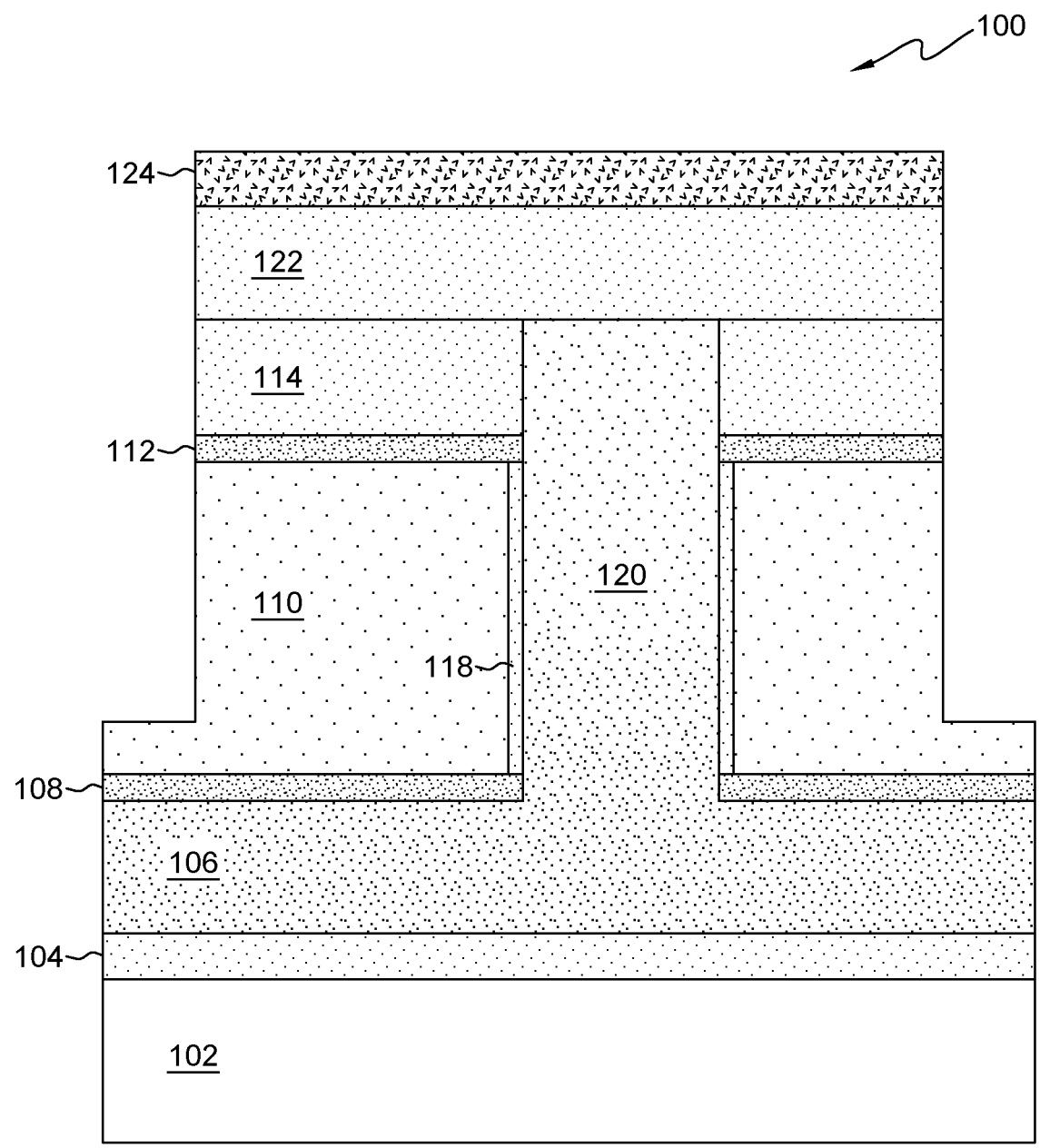
FIG. 5 is a cross section view illustrating portions of the first dielectric layer, second dielectric layer, first spacer, and sacrificial layer removed according to an exemplary embodiment.

Referring now to FIG. 5, the structure 100 with portions of the first dielectric layer 114, second dielectric layer 122, second spacer 112, and sacrificial layer 110 removed is shown, in accordance with an embodiment. After the first mask 124 is formed, an etch process, such as, for example, a reactive ion etch process, is used to recess the second dielectric layer 122, first dielectric layer 114, second spacer 112 and portions of the sacrificial layer 110. The sacrificial layer 110 is recessed to a point as to not expose the top surface of the first spacer 108. As a result, a portion of the sacrificial layer 110 along the top surface of the first spacer 108 remains.

Figure 6:
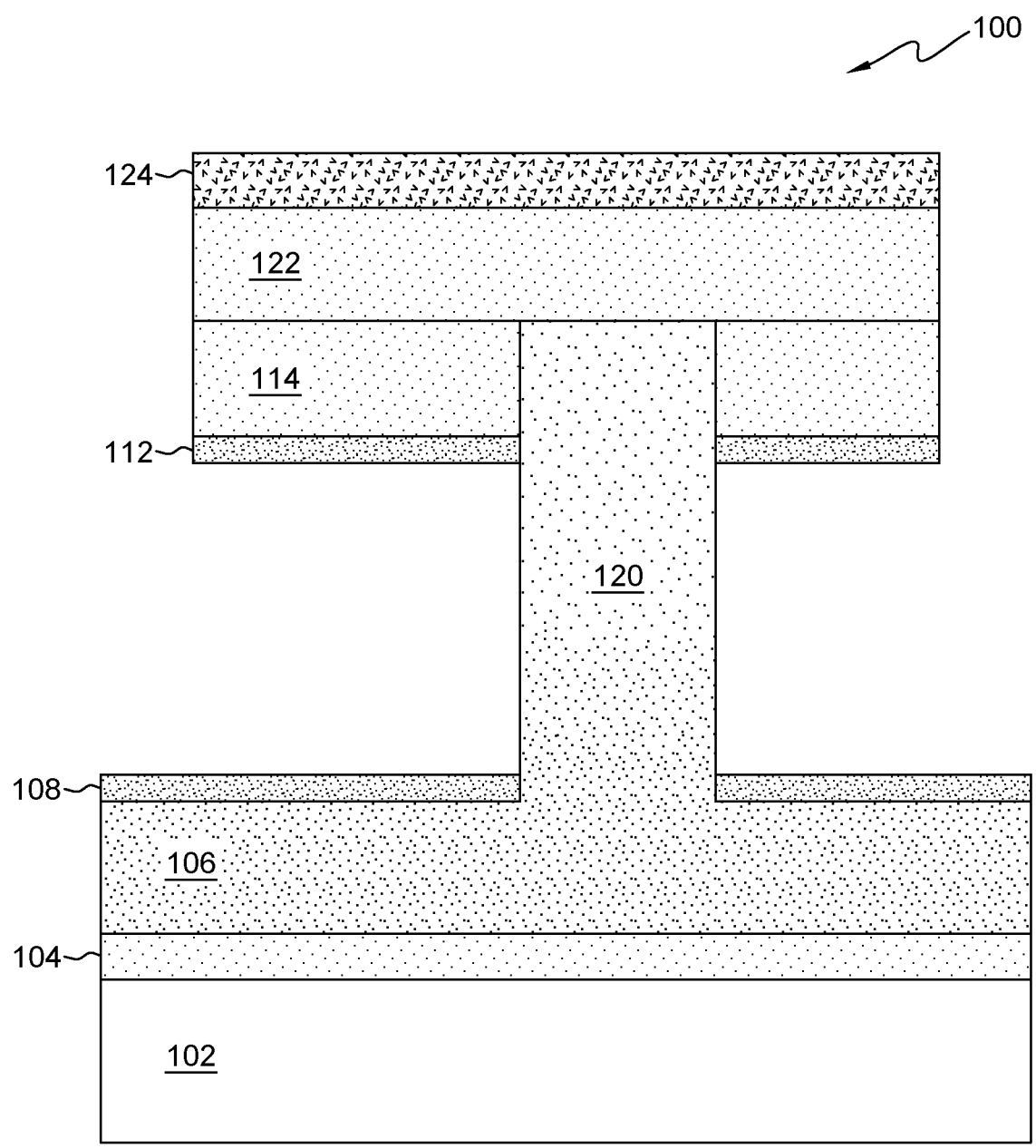
FIG. 6 is a cross section view illustrating exposed sidewalls of the intrinsic base after the sacrificial layer is removed according to an exemplary embodiment.

Referring now to FIG. 6, the structure 100 with exposed sidewalls of the intrinsic base 120 is shown, in accordance with an embodiment. Substantially all of the sacrificial layer 110 and the oxide 118 are removed. A first etch process, such as, for example, a wet etch process, may be used to remove the sacrificial layer 110, exposing the top surface of the first spacer 108, the bottom surface of the second spacer 112, and the oxide 118 (illustrated in FIGS. 2-5). Another etch process, such as, for example, a buffered oxide etch or another form of isotropic etch, may be used to remove the oxide 118 exposing the sidewalls of the intrinsic base 120.

Figure 7:
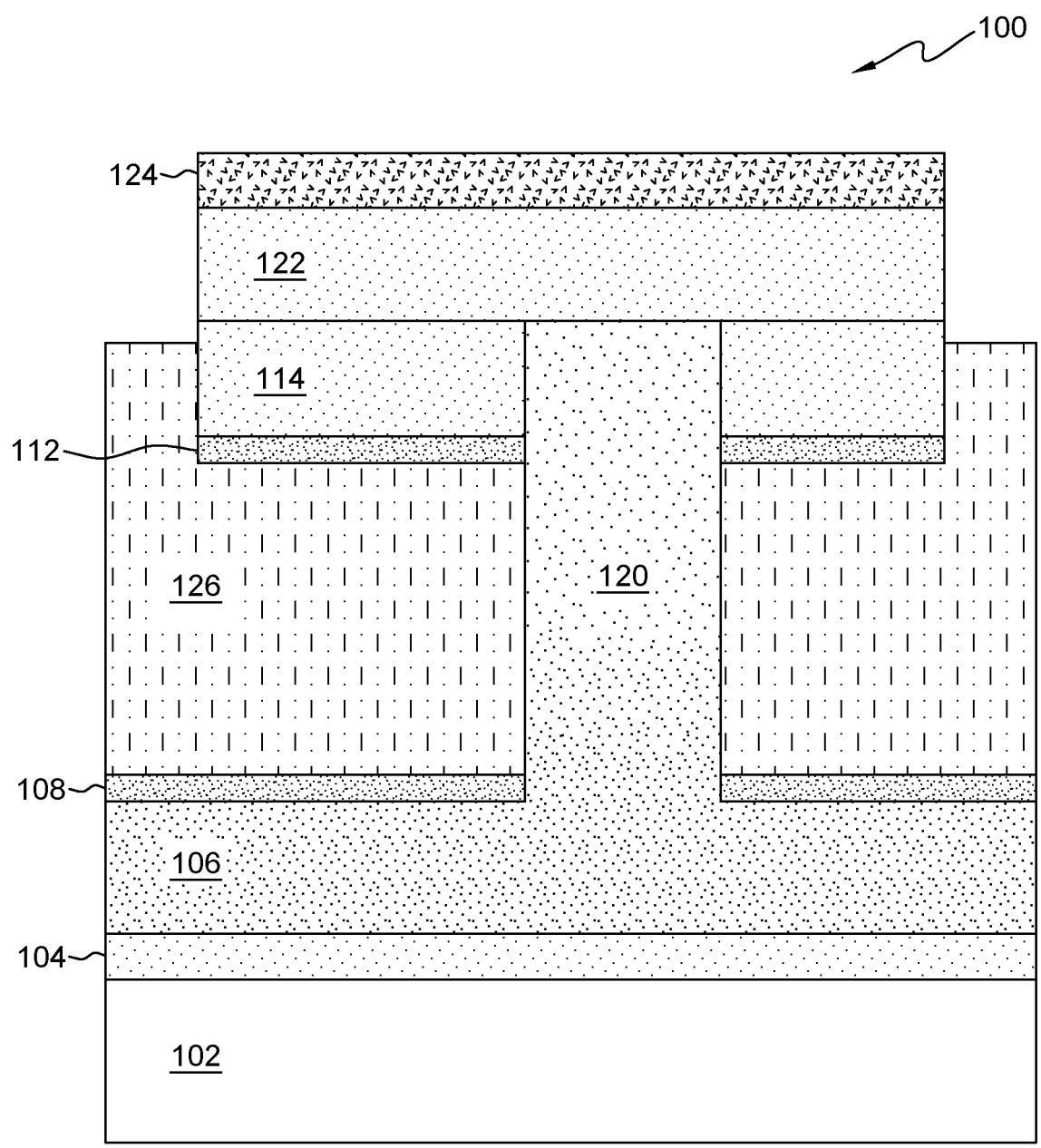
FIG. 7 is a cross section view illustrating an extrinsic base surrounding the intrinsic based according to an exemplary embodiment.

Referring now to FIG. 7, the structure 100 with an extrinsic base 126 is shown, in accordance with an embodiment. A large grain polycrystalline epitaxial layer is grown on the exposed top surface of the first spacer 108 and along exposed sidewalls of the intrinsic base 120 to form the extrinsic base 126. The extrinsic base 126 may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The extrinsic base 126 may be comprised of a compound semiconductor, such as III-V material, or an elemental semiconductor such as polysilicon.

The extrinsic base 126 is in-situ highly doped with a p-type dopant, such as, for example, magnesium for a compound semiconductor, or boron for polysilicon. The extrinsic base 126 is doped with the same type of dopant as the intrinsic base 120. The extrinsic base 126 typically includes a higher level of dopant than the intrinsic base 120 to facilitate formation of a low resistance external contact and also reducing the base recombination current (and therefore base leakage) by repelling minority carriers. An all-around extrinsic base 126 is beneficial in reducing the base access resistance as well as improving electrostatic control over the intrinsic base 120. In some embodiments, the extrinsic base 126 has a wider bandgap compared to the intrinsic base 120, which is beneficial in repelling minority carriers and therefore reducing the base leakage.

Figure 8:
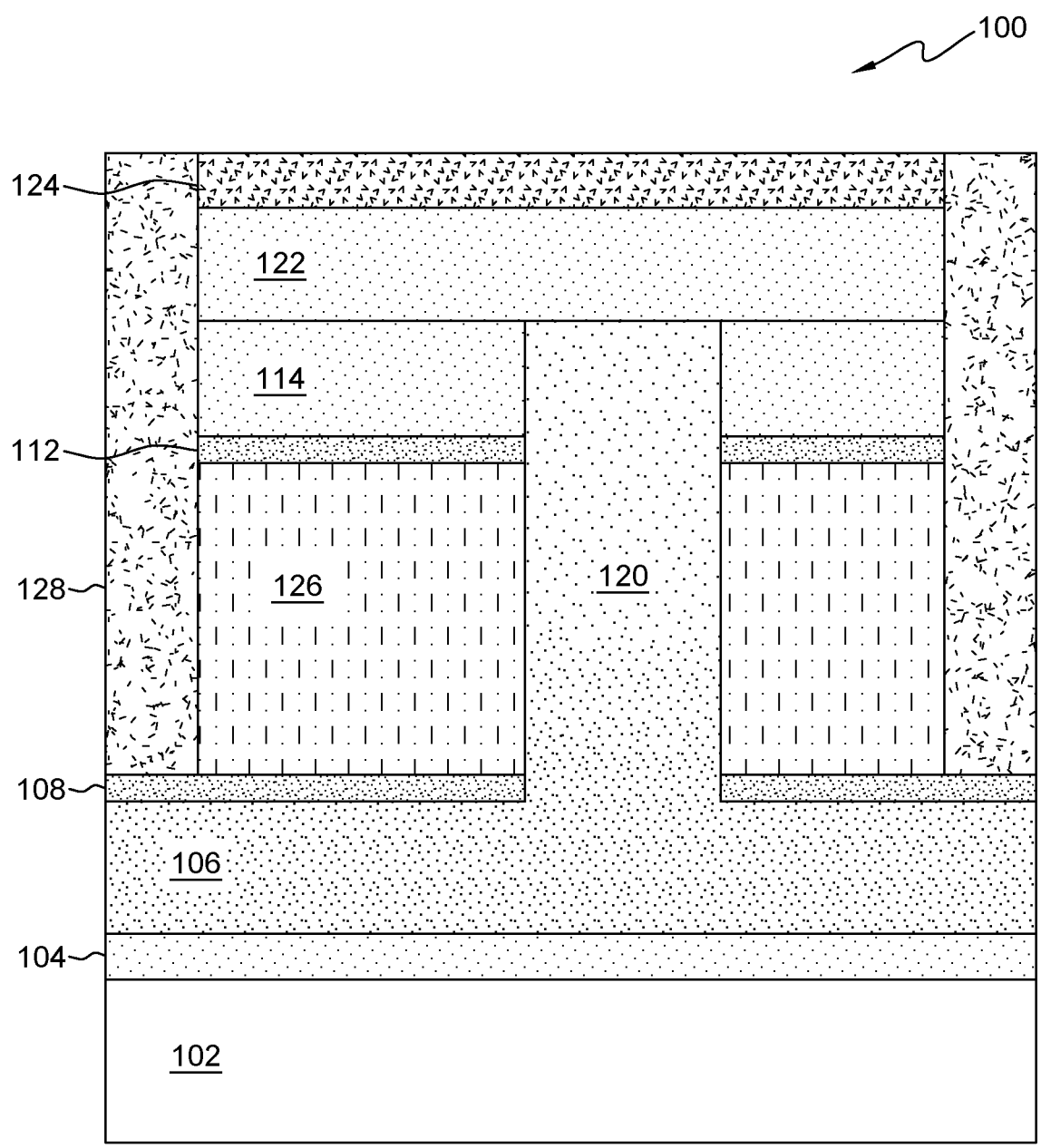
FIG. 8 is a cross section view illustrating etching portions of the extrinsic base and depositing an interlayer dielectric according to an exemplary embodiment.

Referring now to FIG. 8, the structure 100 with a first interlayer dielectric (ILD) 128 is shown, in accordance with an embodiment. The structure 100 with the formed extrinsic base 126 undergoes an etch process, such as a reactive ion etch process, to remove portions of the extrinsic base 126 that extend beyond the first mask 124, exposing portions of the top surface of the first spacer 108. The first ILD 128 may be deposited onto the exposed portions of the top surface of the first spacer 108.

The first ILD 128 is deposited such that top surface of the first ILD 128 is substantially flush with the top surfaces of the mask 124. The first ILD 128 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The first ILD 128 is deposited by a deposition process, including, but not limited to CVD, PVD, plasma enhanced CVD, atomic layer deposition (ALD), evaporation, chemical solution deposition, or like processes. After the first ILD 128 is deposited, a planarization process, such as, for example, a CMP process, may be used to remove excess first ILD 128 from the top surface of the structure 100.

Figure 9:
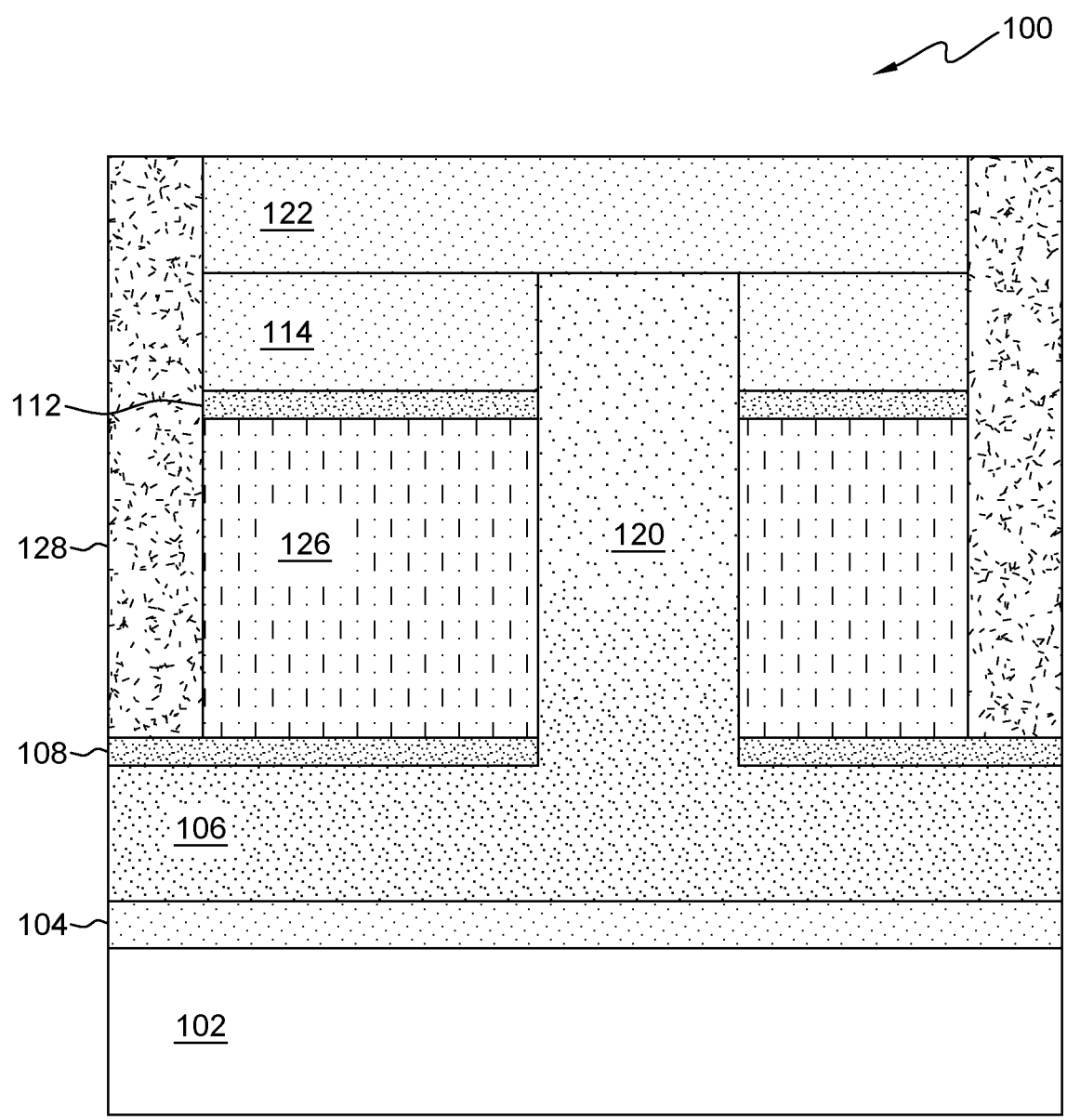
FIG. 9 is a cross section view illustrating removing the first mask to expose a top surface of the second dielectric layer according to an exemplary embodiment.

Referring now to FIG. 9, the structure 100 with the first mask 124 removed is shown, in accordance with an embodiment. The first mask 124 is removed using known techniques to expose the top surface of the second oxide layer 122. After the first mask 124 is removed, an optional planarization process, such as, for example, a CMP process, may be used to remove any traces of the first mask 124 from the top surface of the second oxide layer 122.

Figure 10:
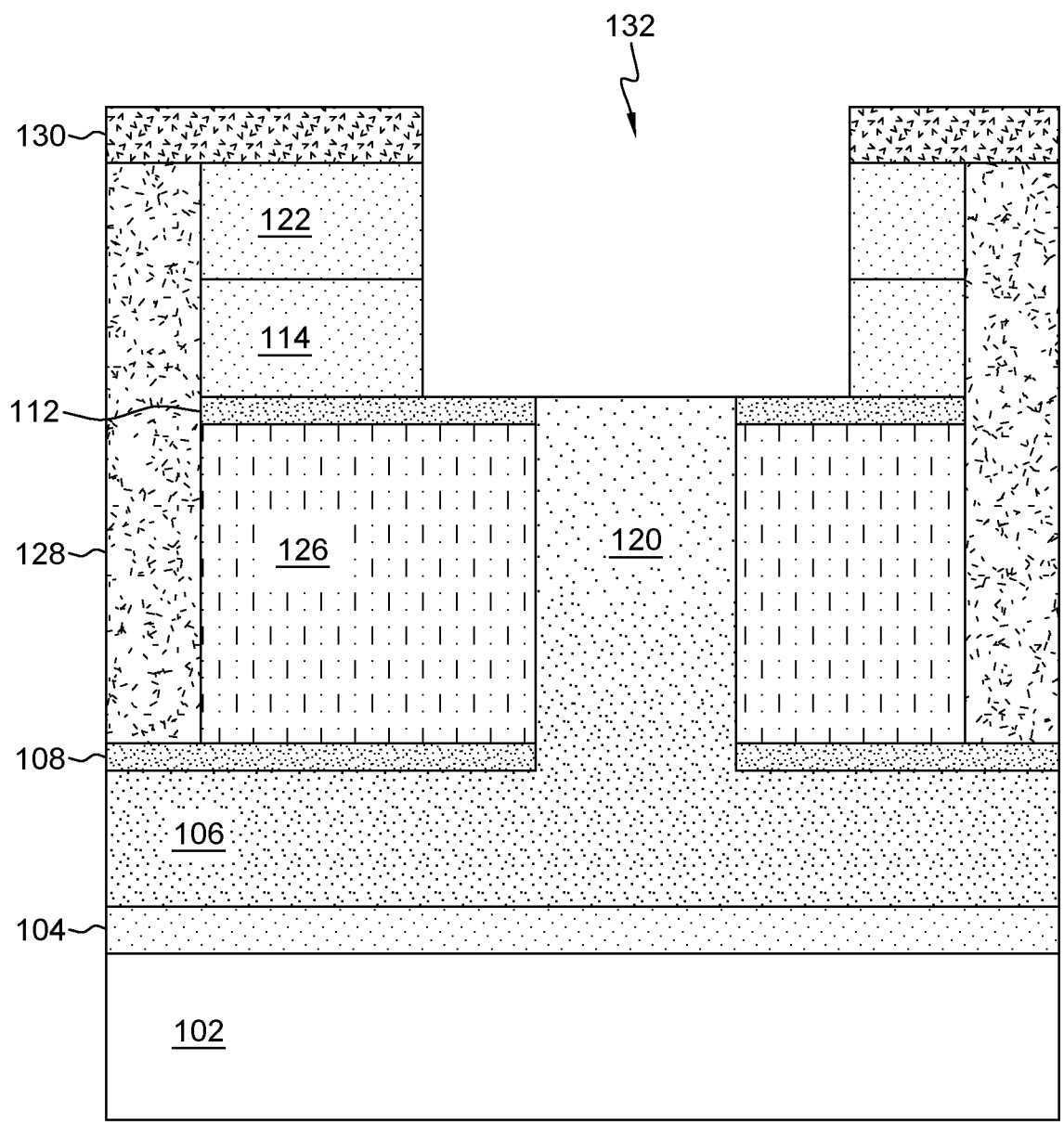
FIG. 10 is a cross section view illustrating forming an opening within the first and second dielectric layers according to an exemplary embodiment.

Referring now to FIG. 10, the structure 100 with an opening 132 is shown, in accordance with an embodiment. A second mask 130 is deposited using known deposition techniques, such as, for example, atomic layer deposition. The second mask 130 may be made of material that is the same or substantially the same as the material of the first mask 124. A top surface portion of the second dielectric layer 122 above the intrinsic base 120 is then removed using known patterning techniques (e.g. using patterned photoresist as an etch mask). The second mask 130 protects the portions of the structure 100 that are covered by the second mask 130 from damage during subsequent fabrication processes.

After the second mask 130 is deposited, an etch process, such as, for example, a reactive ion etch process, is used to remove portions of the second dielectric layer 122 not covered by the second mask 130. The etch process also removes portions of the first dielectric layer 114 to create an opening 132 and expose the top surface of the second spacer 112. The opening 132 extends from the top surface of the second mask 130 to the top surface of the second spacer 112. The opening 132 is wider than the intrinsic base 120 and encompasses the intrinsic base 120.

Figure 11:
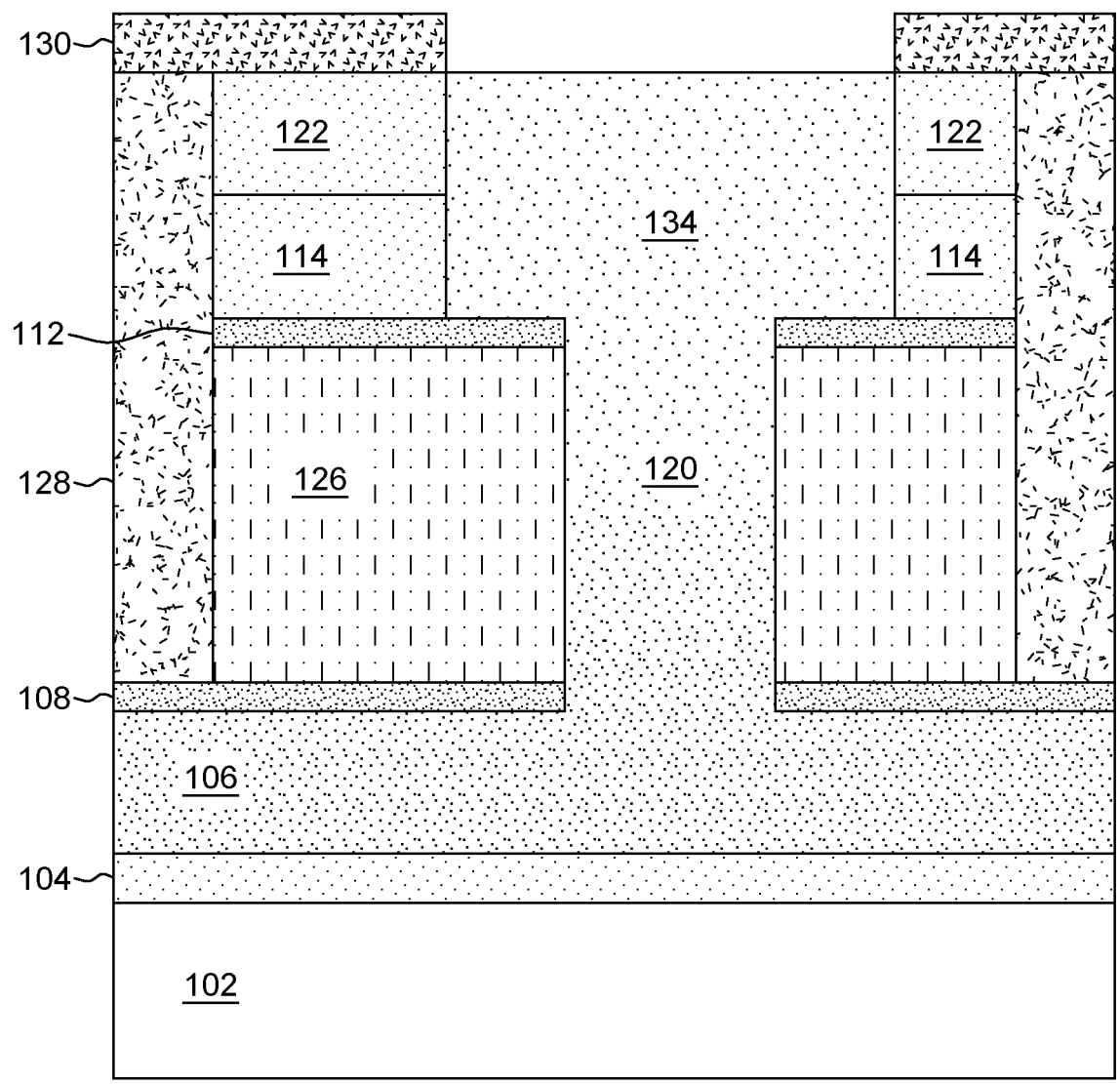
FIG. 11 is a cross section view illustrating forming a collector according to an exemplary embodiment.

Referring now to FIG. 11, the structure 100 with a collector 134 is shown, in accordance with an embodiment. A single-crystalline or a large-grain polycrystalline layer is grown epitaxially on the exposed top surface of the intrinsic base 120 and the second spacer 112 to form the collector 134. The collector 134 may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The collector 134 may be made of indium aluminum arsenide, indium phosphide, or indium gallium phosphide, in some embodiments.

The collector 134 is highly doped with an n-type dopant, such as, for example, tellurium. The collector 134 may be doped with the same dopant as the emitter 106 but with a different dopant as the intrinsic base 120 and the extrinsic base 126. In some embodiments, the collector 134 has a top portion highly doped with an n-type dopant (e.g. to reduce series resistance) and a bottom portion with relatively lower doping of the same type, e.g. moderately doped with an n-type dopant (e.g. to reduce Auger recombination). In an embodiment, the collector 134 and the emitter 106 may be highly doped with an n-type dopant whereas the intrinsic base 120 and the extrinsic base 126 may be doped with a p-type dopant, such as magnesium. Further, the extrinsic base 126 may be doped to a higher level whereas the intrinsic base 120 may be doped to a lower level. In an embodiment, the collector 134 may be referred to as a second emitter or collector 134.

Figure 12:
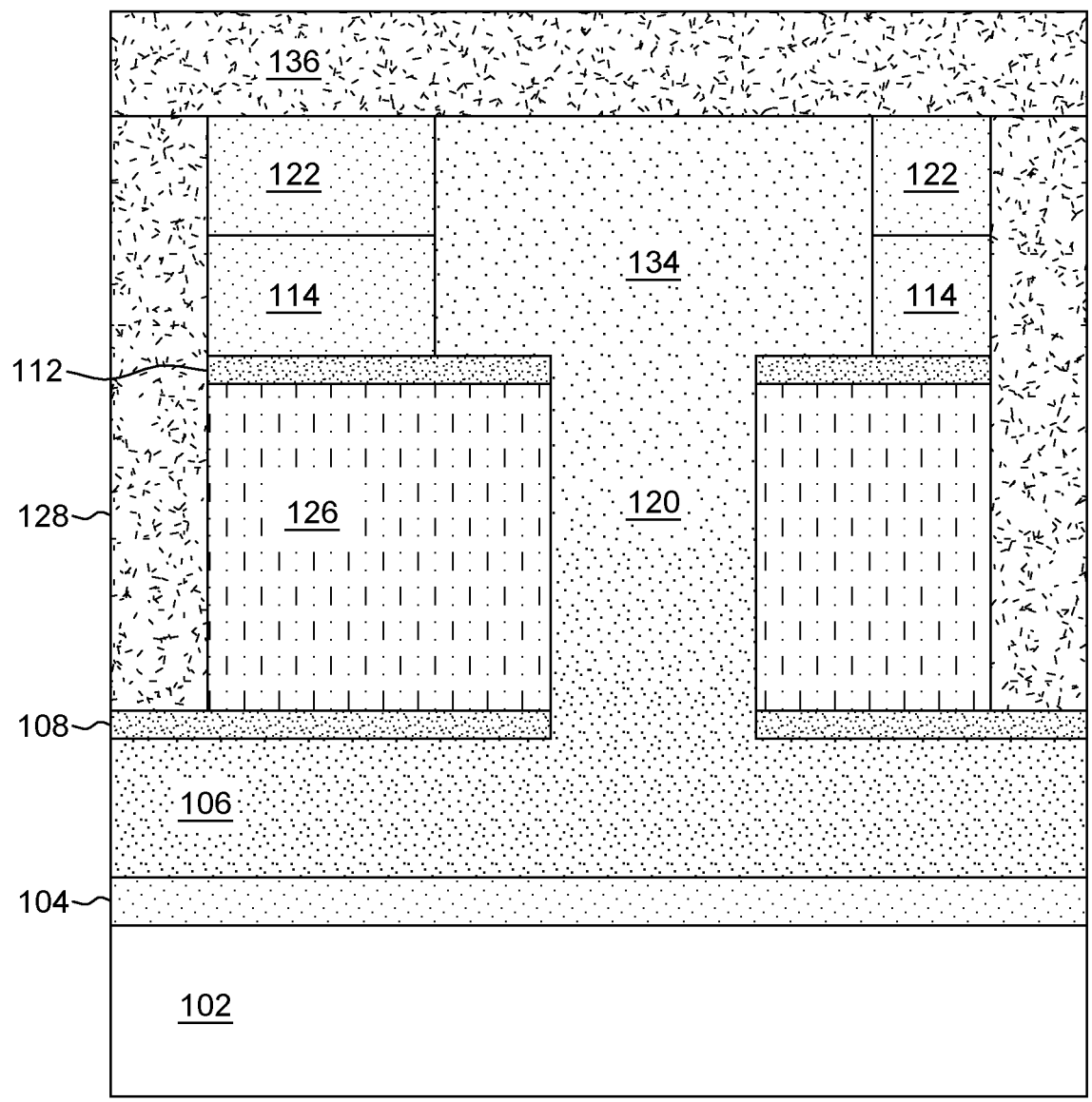
FIG. 12 is a cross section view illustrating depositing a second interlayer dielectric on top of the collector according to an exemplary embodiment.

Referring now to FIG. 12, the structure 100 with a second interlayer dielectric (ILD) 136 is shown, in accordance with an embodiment. Once the collector 134 is epitaxially grown, the second mask 130 is removed. An optional planarization process, such as, for example, a CMP process, may be used to remove any traces of the second mask 130 from the top surface of the second oxide layer 122 and the first ILD 128. The second ILD 136 may be deposited such that the top surface of the collector 134 is completely covered by the second ILD 136. The second ILD 136 may be made of material that are identical or substantially identical to the materials of the first ILD 128. The second ILD 136 is deposited by a deposition process, including, but not limited to CVD, PVD, plasma enhanced CVD, atomic layer deposition (ALD), evaporation, chemical solution deposition, or like processes. After the second ILD 136 is deposited, a planarization process, such as, for example, a CMP process, may be used to remove excess second ILD 136 from the top surface of the structure 100.

Figure 13A:
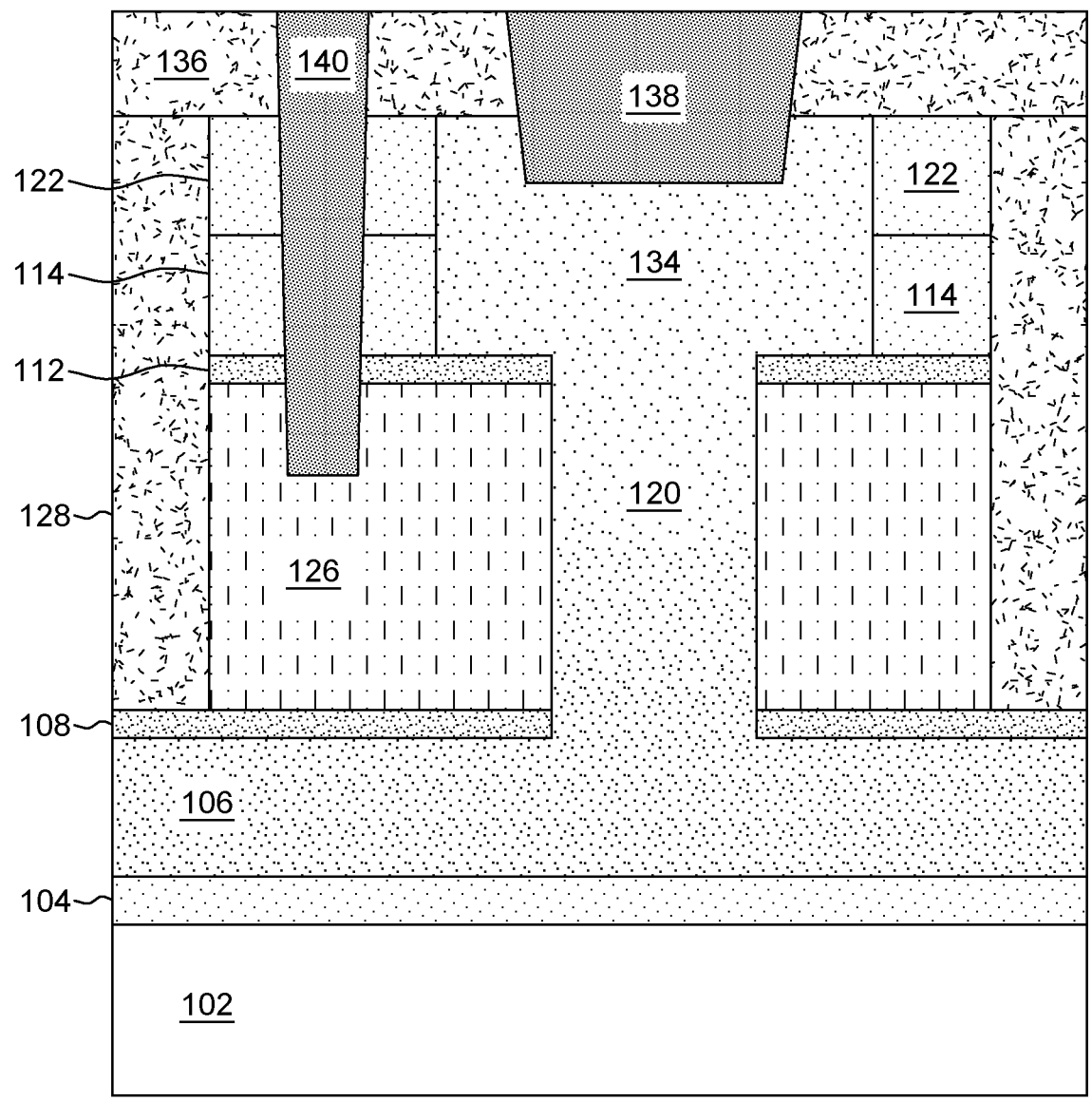
FIG. 13a is a cross section view illustrating forming contacts according to an exemplary embodiment.

Referring now to FIG. 13*a*, the structure 100 with a collector contact 138 and an extrinsic base contact 140 is shown, in accordance with an embodiment. The collector contact 138 extends through the second ILD 136 to the collector 134 and is formed within a trench. To remove the second ILD 136 and form the collector contact trench, a resist, such as a photoresist, may be deposited and patterned. An etch process, such as a RIE, may be performed using the patterned resist as an etch mask to remove the second ILD 136 until the collector 134 is exposed. The collector contact trench is filled with a conductive material or a combination of conductive materials to form the collector contact 138. The conductive material filling may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the second ILD 136.

The extrinsic base contact 140 extend from the surface of the second ILD 136, through the second dielectric layer 122, the first dielectric layer 144, the second spacer 112 to the extrinsic base 126. The extrinsic base contact 140 is formed by patterning a trench in the second ILD 136. To remove the second ILD 136, the second dielectric layer 122, the first dielectric layer 144, the second spacer 112, and the extrinsic base 126 and form the extrinsic base contact trench, a resist, such as a photoresist, may be deposited and patterned. An etch process, such as a RIE, may be performed using the patterned resist as an etch mask to remove the second ILD 136, the first and second dielectric layers 112, 122, the second spacer 112 until the extrinsic base 126 is exposed. The gate contact trenches are filled with a conductive material or a combination of conductive materials to form the extrinsic base contact 140. The conductive material may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the second ILD 136.

Figure 13B:
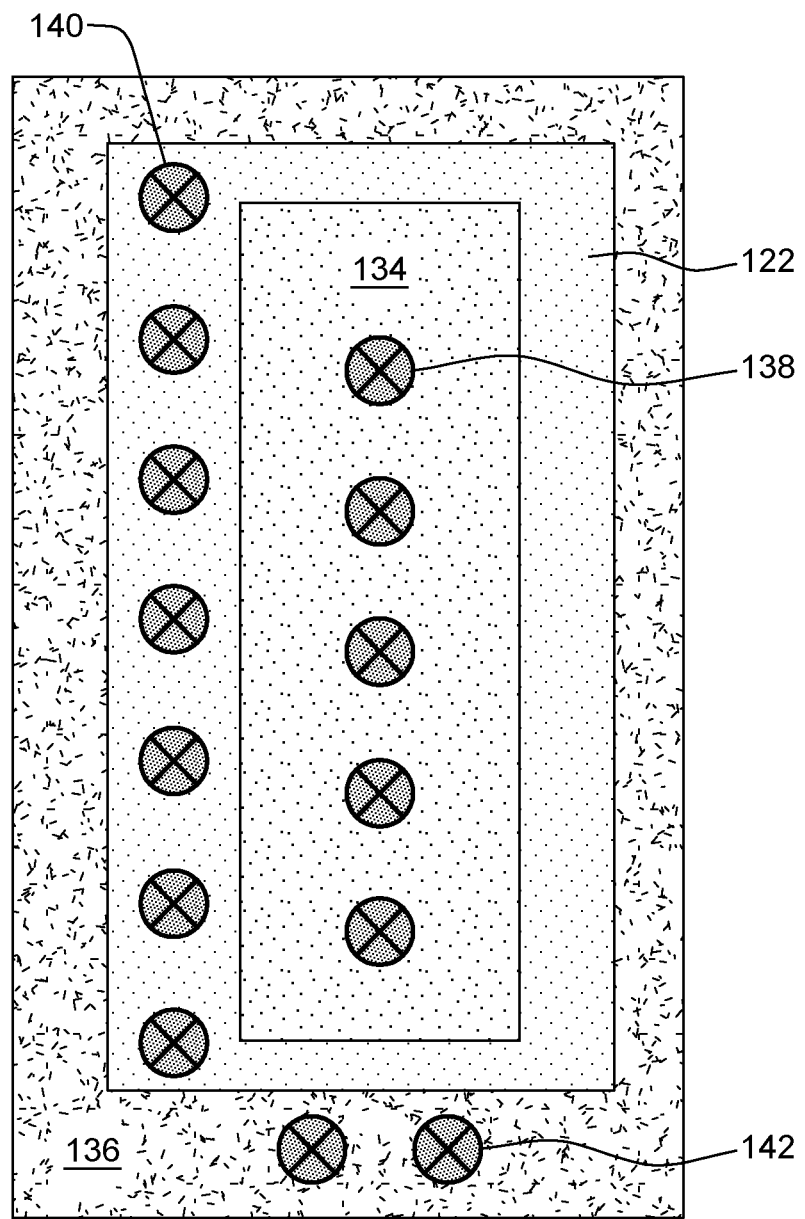
FIG. 13b is a top view illustrating contacts according to an exemplary embodiment.

Referring now to FIG. 13*b*, a top view of the structure 100 with the collector contacts 138, the extrinsic base contacts 140, and emitter contacts 142 is shown, in accordance with an embodiment. The emitter contacts 142 are formed above and in direct contact with the emitter 106. The emitter contacts 142 may be made of conductive metal, for example, aluminum (Al), platinum (Pt), gold (Au), tungsten (W), titanium (Ti), or any combination thereof.

The resultant structure 100, as illustrated in FIGS. 13a-b, includes a vertical compound semiconductor BJT with an all-around extrinsic base 126 surrounding a graded intrinsic base 120. Forming the whole BJT structure with epitaxy allows each epitaxially grown layer, such as, for example, the emitter 106, the intrinsic base 120, the extrinsic base 126, and the collector 134, to have a bandgap that may be controlled precisely and also varied gradually (i.e. graded) as desired during the epitaxial growth. In addition, each of the said epitaxially grown layers may be doped with different dopants and at different doping levels which may also be varied during epitaxial growth as desired. This allows custom tuning for a wide range of applications of the BJT, including high-speed devices based on narrow-bandgap semiconductor materials and high-voltage devices based on wide-bandgap semiconductor materials. The emitter 106, the intrinsic base 120, and the collector 134 may be made of a III-V semiconductor material. While the exemplary embodiment described with respect to FIG. 1-13 is an n-p-n bipolar transistor, it will be appreciated that a p-n-p bipolar transistor may be formed in a similar manner by reversing the doping types.

Having the intrinsic base 120 surrounded by the extrinsic base 126 reduces the base access resistance and improves the device electrostatics. In addition, embodiments of the present invention enable the manufacturing of dense vertical transistors with all-around extrinsic bases 126 by eliminating the need for sidewall etching, i.e. tapering or patterning the device layers in a stepwise manner to create access areas for forming contact to the different layers. Eliminating the sidewall etch also eliminates etch damage to the sidewalls and therefore the recombination current and resulting leakage associated with sidewall damage.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A vertical bipolar junction transistor comprising:
   an intrinsic base on a first emitter or collector, wherein the intrinsic base is compositionally graded and has a lattice constant that is substantially the same as the lattice constant of the first emitter or collector;
   a second collector or emitter formed on the intrinsic base; and
   an extrinsic base formed all-around the intrinsic base, the extrinsic base is isolated from the first emitter or collector by a first spacer, the extrinsic base is isolated from the second collector or emitter by a second spacer, and the extrinsic base is doped and with the same type of dopant as the intrinsic base, but the extrinsic base is doped with a higher concentration than the intrinsic base.

2. The vertical bipolar junction transistor of claim 1, wherein the first emitter or a collector has a larger bandgap than the intrinsic base.

3. The vertical bipolar junction transistor of claim 1, wherein the extrinsic base has a larger bandgap than the intrinsic base.

4. The vertical bipolar junction transistor of claim 1, wherein the intrinsic base is doped with a p-type dopant, and the first emitter or collector and the second collector or emitter are doped with an n-type dopant.

5. The vertical bipolar junction transistor of claim 1, wherein the intrinsic base is doped with a n-type dopant, and the first emitter or collector and the second collector or emitter are doped with a p-type dopant.

6. The vertical bipolar junction transistor of claim 1, wherein the first emitter or collector, the intrinsic base, and the second collector or emitter are made of a III-V semiconductor material.

7. The vertical bipolar junction transistor of claim 1, wherein the emitter and collector are interchangeable depending on polarity of voltage.

8. The vertical bipolar junction transistor of claim 1, wherein the intrinsic base includes at least a first metal and a second metal, and wherein a bottom portion of the intrinsic base closest to the first emitter comprises a higher concentration of the first metal than the second metal so that the bottom portion of the intrinsic base has a smaller bandgap when compared to the bandgap of the top portion of the intrinsic base.

9. The vertical bipolar junction transistor of claim 8, wherein the first metal is aluminum and the second metal is gallium.

10. The vertical bipolar junction transistor of claim 8, wherein the intrinsic base comprises indium aluminum gallium arsenide.

11. The vertical bipolar junction transistor of claim 8, wherein the intrinsic base comprises indium aluminum gallium arsenide.

12. A vertical bipolar junction transistor comprising:
    an intrinsic base on a first emitter or collector, wherein the intrinsic base is compositionally graded and has a lattice constant that is substantially the same as the lattice constant of the first emitter or collector;
    an isolation layer separating the first emitter or collector from a substrate;
    a second collector or emitter formed on the intrinsic base; and
    an extrinsic base formed all-around the intrinsic base, the extrinsic base is isolated from the first emitter or collector by a first spacer, the extrinsic base is isolated from the second collector or emitter by a second spacer, and the extrinsic base is doped and with the same type of dopant as the intrinsic base, but the extrinsic base is doped with a heavier concentration than the intrinsic base.

13. The vertical bipolar junction transistor of claim 12, wherein the first emitter or a collector has a larger bandgap than the intrinsic base.

14. The vertical bipolar junction transistor of claim 12, wherein the extrinsic base has a larger bandgap than the intrinsic base.

15. The vertical bipolar junction transistor of claim 12, wherein the intrinsic base is doped with a p-type dopant, and the first emitter or collector, and the second collector or emitter are doped with an n-type dopant.

16. The vertical bipolar junction transistor of claim 12, wherein the intrinsic base is doped with a n-type dopant, and the first emitter or collector, and the second collector or emitter are doped with a p-type dopant.

17. The vertical bipolar junction transistor of claim 12, wherein the first emitter or collector, the intrinsic base, and the second collector or emitter are made of a III-V semiconductor material.

18. The vertical bipolar junction transistor of claim 12, wherein the emitter and collector in the first emitter or collector and second collector and emitter each are interchangeable depending on polarity of voltage.

19. The vertical bipolar junction transistor of claim 12, wherein a bottom portion of the intrinsic base closest to the first emitter or collector contains more gallium and less aluminum than the top portion of the intrinsic so that the bottom portion of the intrinsic base has a smaller bandgap when compared to the bandgap of the top portion of the intrinsic base.

* * * * *